United States Patent
Ito et al.

(10) Patent No.: US 6,216,255 B1
(45) Date of Patent: Apr. 10, 2001

(54) COMPUTER-AIDED LOGIC CIRCUIT DESIGNING APPARATUS COMPUTER-AIDED LOGIC CIRCUIT DESIGNING SYSTEM, AND COMPUTER-AIDED LOGIC CIRCUIT DESIGNING METHOD

(75) Inventors: Yasushi Ito; Shinpei Komatsu; Tatsushi Tobita; Chika Kubono; Masaki Kirinaka, all of Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/030,859

(22) Filed: Feb. 26, 1998

(30) Foreign Application Priority Data

Jul. 28, 1997 (JP) .................................................. 9-201906

(51) Int. Cl.[7] ...................................................... G06F 17/50
(52) U.S. Cl. .................................... 716/6; 703/14; 703/19
(58) Field of Search ........................ 395/500.02–500.19, 395/500.35–500.37; 716/1–21; 703/14, 17, 19

(56) References Cited

U.S. PATENT DOCUMENTS

| | | | |
|---|---|---|---|
| 5,452,239 | * 9/1995 | Dai et al. | 703/19 |
| 5,572,717 | * 11/1996 | Pedersen | 713/500 |
| 5,889,677 | * 3/1999 | Yasuda et al. | 716/6 |
| 5,963,728 | * 10/1999 | Hathaway et al. | 716/3 |
| 6,106,568 | * 8/2000 | Beausang et al. | 716/18 |

OTHER PUBLICATIONS

Chu et al. ("Efficient timing analysis for general synchronous and asynchronous circuits", Proceedings of the Third Annual IEEE ASIC Seminar and Exhibit, 1990, Sep. 17, 1990, pp. P5/4.1–P5/4.4).*

Bormann et al. ("Combining asynchronous and synchronous circuits using stretchable clocks", IEE Colloquium on Design and Test of Asynchronous Systems, pp. 4/1–4/8, Jan. 1996).*

Teich et al. ("Performance analysis and optimization of mixed asynchronous synchronous systems", IEEE Transactions on Computer–Aided Design of Integrated Circuits and Systems, vol. 16, No. 5, May 1997, pp. 473–484).*

* cited by examiner

Primary Examiner—Matthew Smith
Assistant Examiner—Phallaka Kik
(74) Attorney, Agent, or Firm—Staas & Halsey LLP

(57) ABSTRACT

A computer-aided logic circuit designing apparatus in which data on a plurality of circuits is stored in a database, the data on a plurality of circuits is read out therefrom and combined by a net list-RTL description combining section, a clock system portion is analyzed based on the logic circuit obtained by combining the data by a clock system analyzing section, and a result of the analysis is displayed by an analysis result display section correlating each type of clock system to a corresponding clock input element.

18 Claims, 14 Drawing Sheets

| TYPE OF CLOCK<br>( CLOCK SYSTEM PATH ) | CLOCK INPUT<br>ELEMENTS | CONDITION |
|---|---|---|
| CLK1 (→AI1) | FFA1,FFA2 | OK |
| CLK1 (→AO1→BI1) | FFB1,FFB2 | OK |
| CLK2 (→AI2) | FFA3,FFA4 | OK |
| FFA4/Q (→AO2→BI2) | FFB3,FFB4 | WARNING |
| FFA4/Q (→BO2→CI2) | FFC3,FFC4 | WARNING |
| A,B (BA,BB→BO1→CI1) | FFC1,FFC2 | WARNING |

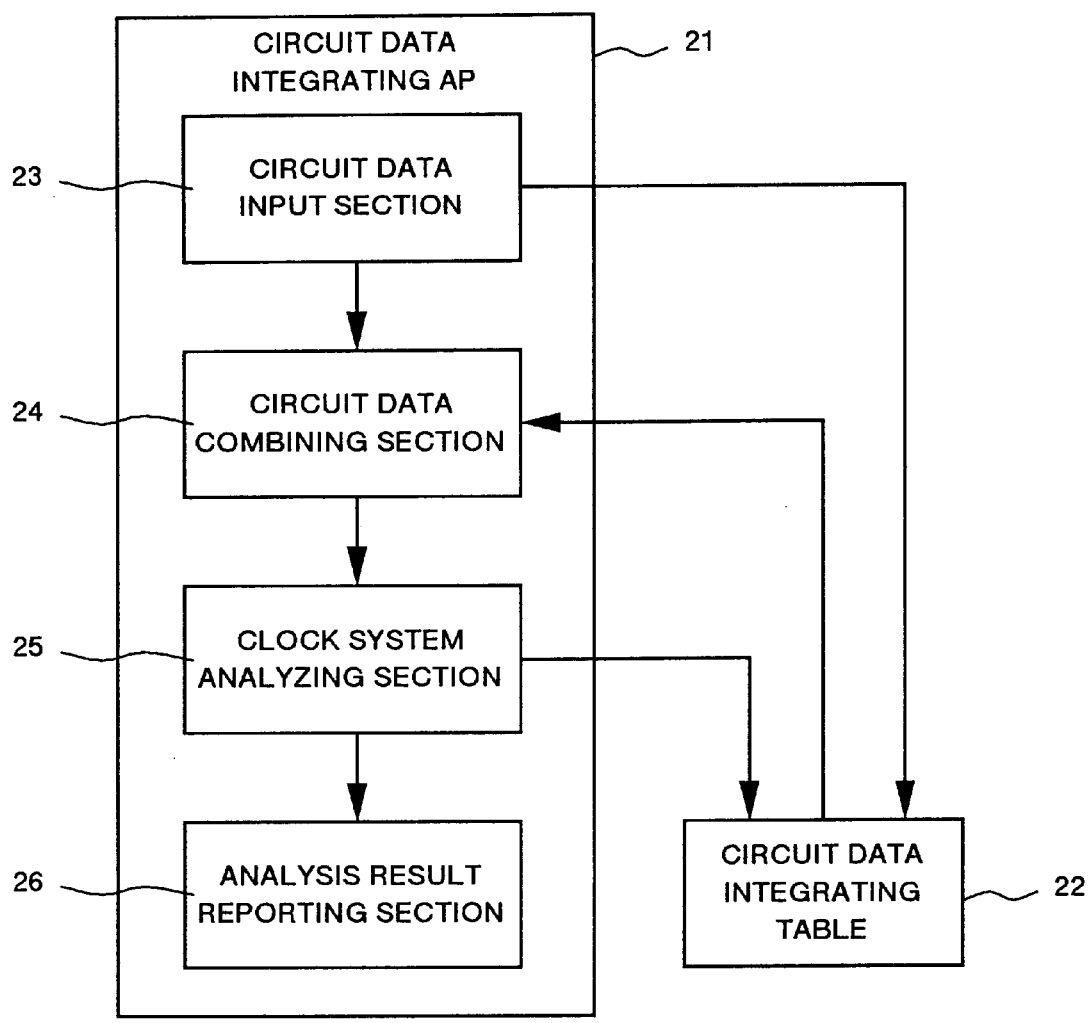

FIG.15

RESA

| TYPE OF CLOCK<br>( CLOCK SYSTEM PATH ) | CLOCK INPUT ELEMENTS |
|---|---|
| CLK1 | FFA1,FFA2 |
| CLK2 | FFA3,FFA4 |
| CLK1 (→AO1) | FFB1,FFB2 |
| FFA4/Q (→AO2) | FFB3,FFB4 (W) |

FIG.16

RESB

| TYPE OF CLOCK<br>( CLOCK SYSTEM PATH ) | CLOCK INPUT ELEMENTS |
|---|---|
| CLK1 | FFB1,FFB2 |
| FFA4/Q | FFB3,FFB4 |
| FFA4/Q (→BO2) | FFC3,FFC4 (W) |
| A,B (→BO1) | FFC1,FFC2 (W) |

FIG.17

RESC

| TYPE OF CLOCK | CLOCK INPUT ELEMENTS |
|---|---|
| A,B | FFC1,FFC2 (W) |
| FFA4/Q | FFC3,FFC4 (W) |

WARNING

TYPE OF CLOCK : FFA4/Q (→AO2)

CLOCK INPUT ELEMENT : FFB3,FFB4

*EXAMINATION IS NEEDED FOR
 MEASURES AGAINST HAZARDS

WARNING

⎡ TYPE OF CLOCK : FFA4/Q (→BO2)
⎣ CLOCK INPUT ELEMENT : FFC3,FFC4

⎡ TYPE OF CLOCK : A,B (→BO1)
⎣ CLOCK INPUT ELEMENT : FFC1,FFC2

*EXAMINATION IS NEEDED FOR MEASURES
 AGAINST HAZARDS AS WELL AS MEASURES
 FOR SYNCHRONIZATION

FIG.20

```
WARNING
  ┌ TYPE OF CLOCK      : A,B
  └ CLOCK INPUT ELEMENT : FFC1,FFC2
  ┌ TYPE OF CLOCK      : FFA4/Q
  └ CLOCK INPUT ELEMENT : FFC3,FFC4
 * EXAMINATION IS NEEDED FOR MEASURES
   FOR SYNCHRONIZATION AS WELL AS
   MEASURES AGAINST HAZARDS
```

53C

COMPUTER-AIDED LOGIC CIRCUIT DESIGNING APPARATUS COMPUTER-AIDED LOGIC CIRCUIT DESIGNING SYSTEM, AND COMPUTER-AIDED LOGIC CIRCUIT DESIGNING METHOD

FIELD OF THE INVENTION

The present invention relates to a computer-aided logic circuit designing apparatus, a computer-aided circuit designing system, and a computer-aided logic circuit designing method for designing logic circuits using, for instance, hardware description language (HDL) by means of an abstract description method such as a register transfer level (RTL) or the like.

BACKGROUND OF THE INVENTION

In recent years, in association with increase in an integration degree of LSIs, a scale of a circuit on which the LSIs are mounted has been becoming increasingly larger. The HDL is employed for a designing method in association with the tendency for larger scale integration. Because of the tendency, now logic circuits are designed by a plurality of designers each responsible for each block and by means of combining the blocks into one circuit, analyzing a clock system of each block.

When integrating a plurality of blocks into one circuit, if a clock is supplied to a block designed by one person from a block designed by another person and the clock is, for instance, a gated clock, a malfunction may occur in the block designed by the person due to generation of a hazard or for other reasons. In the case as described above, a designer of the block from which a clock is supplied intentionally notifies, in anticipation of the possibility of troubles such as generation of a hazard, a designer of the block to which the clock is supplied of the possibility.

However, if the designer of the block from which the clock is supplied does not notify the designer of the block to which the clock is supplied of the possibility of generation of a hazard or other trouble, or the former designer cannot anticipate the possibility, a trouble may be generated due to a hazard or for other reasons when integrating blocks For this reason, because of inadequate communication between designers or due to shortage of data, a vast quantity of time is required to analyze a cause for a trouble generated when combining blocks, which in return disadvantageously lowers the work efficiency. Especially when an unknown macro or a macro based on unclear specifications is incorporated into a system, and when old resources such as a portion of a net list used previously is used, analysis of the trouble is extremely difficult.

SUMMARY OF THE INVENTION

It is an object of the present invention to provide a computer-aided logic circuit designing apparatus, a computer-aided logic circuit designing system, and a computer-aided logic circuit designing method which can notify a designer of troubles in a clock system portion or an asynchronous portion in a logic circuit being designed to improve the work efficiency.

With the present invention, data on a plurality of circuits is combined, a clock system portion is analyzed based on a logic circuit obtained by combining the data, and a result of analysis is displayed differentiating clock systems from each other, so that a trouble generated in a clock system portion in any of a plurality of blocks can clearly be known from a logic circuit being designed, and a long time is not required for analyzing a cause for the trouble, and for this reason the work efficiency can be improved.

With the present invention, data on a plurality of circuits is combined, a clock system portion is analyzed based on a logic circuit obtained by combining the data, a result of the analysis is displayed correlating a clock input element to each type of clock system, so that a trouble relating to a clock input element in a clock system portion in any of a plurality of blocks can clearly be identified from a logic circuit being designed and a long time is not required for analyzing a cause for each trouble, and for this reason the work efficiency can be improved.

With the present invention, data on a plurality of circuits is previously stored, the data on the plurality of circuits is combined, a clock system portion is analyzed based on the logic circuit obtained by combining the data, and a result of the analysis is displayed differentiating clock system types from each other, so that a trouble in a clock system portion in each of a plurality of blocks can clearly be identified from a logic circuit being designed, and a long time is not required for analyzing a cause for the trouble even if a portion or all of old resources is used, and for this reason the work efficiency can be improved.

With the present invention, data on a plurality of circuits is stored, the data on a plurality of circuits is combined, a clock system portion is analyzed based on the logic circuit obtained by combining the data, and a result of the analysis is displayed correlating a clock input element to each type of clock system, so that a trouble relating to a clock input element in a clock system portion of any of a plurality of blocks can clearly be identified from a logic circuit being designed, and a long time is not required for analyzing a cause for the trouble even if a portion or all of old resources is used, and for this reason the work efficiency can be improved.

With the present invention, data on each circuit is modified based on the display result of analysis, so that a work for correcting the trouble can immediately be started after analysis, and for this reason the work efficiency can be improved.

With the present invention, an asynchronous circuit portion is extracted from the logic circuit through analysis of a clock system, and when displaying the result of analysis, an alarm concerning the extracted asynchronous circuit portion is generated, so that the asynchronous circuit portion is clearly identified through the analysis of a clock system and a long time is not required for analyzing a cause for the trouble even in not only the clock system but also the asynchronous circuit portion, and for this reason the work efficiency can be improved.

With the present invention, the data for each circuit is corrected based on a displayed result of analysis to evade hazards in a clock system and for synchronization for an asynchronous circuit portion, so that a work for correcting the trouble in the clock system portion and the asynchronous circuit portion can immediately be started after analysis, and for this reason the work efficiency can be improved.

With the present invention, the analysis result in which data for types of clock system, data on clock input elements, and warning data concerning to troubles in clock systems are correlated to each other is obtained through analysis of the clock system, so that a state of the clock system obtained through analysis of the clock system can easily be checked on the whole.

With the present invention, a clock path for each type of clock system is further correlated to data for types of clock system, data on clock input elements, and warning data concerning troubles in clock systems, so that a state of combining clock paths between blocks can easily be checked.

With the present invention, each client designs data on a circuit having a clock system portion, sends a request for analysis of data on the designed circuit to the server, and displays a result of analysis reported from the server after a request for analysis is sent differentiating clock systems from each other; and the server combines data on circuits sent from the plurality of clients respectively upon the request, analyzes a clock system portion based on a logic circuit obtained by combining the data, and reports the result of analysis to the plurality of clients, so that the server can centralize management of troubles in the clock system portion in any of the plurality of blocks from a logic circuit being designed in each client, and there is no load to analyze a cause for the trouble by a client side, and for this reason the work efficiency in the entire system can be improved.

With the present invention, each of the clients designs data on a circuit having one or a plurality of clock input elements each constituting a clock system portion, sends a request for analysis of data on the designed circuit to the server, and displays a result of analysis reported, after a request for analysis, from the server correlating a clock input element to each type of clock system; and the server combines data on circuits sent from the plurality of clients respectively, analyzes a clock system portion based on the logic circuit obtained by combining the data, and reports the result of analysis to the plurality of clients, so that the server can centralize management of troubles concerning a clock input element in the clock system portion in any of the plurality of blocks from a logic circuit being designed in each client, and there is no load to analyze a cause for the trouble by a client side, and for this reason the work efficiency in the entire system can be improved.

With the present invention, each client corrects the data on the circuit based on the displayed analysis result, so that a work for correcting the trouble can immediately be started in each client after analysis by the server, and for this reason the work efficiency can be improved.

With the present invention, an asynchronous circuit portion is extracted from the logic circuit by means of clock system analysis in the server, and when displaying the result of analysis in each client, an alarm for the extracted asynchronous circuit portion is generated, so that the asynchronous circuit portion is clearly identified through the analysis of a clock system and, in each client, a long time is not required for analyzing a cause for the trouble even in not only the clock system but also the asynchronous circuit portion, and for this reason the work efficiency on the system can be improved.

With the present invention, each client corrects the data for each circuit to evade hazards for a clock system portion and for synchronization for the asynchronous circuit portion based on the displayed result of analysis, so that a work for correcting the trouble in the clock system portion and the asynchronous circuit portion can immediately be started after analysis by the server, and for this reason the work efficiency on the system can be improved.

With the present invention, the analysis result in which data for types of clock system, data on clock input elements, and data for warning to troubles in clock systems are correlated to each other is obtained through analysis of the clock system by the server, so that a state of the clock system obtained through analysis of the clock system can easily be checked on the whole in the server.

With the present invention, the server further correlates a clock path for each type of clock to data for types of clock system, data on clock input elements, and data for warning to troubles in clock systems, so that a state of combining clock paths between blocks can easily be checked in each client.

With the present invention, there are steps of combining data on a plurality of circuits, analyzing a clock system portion based on the logic circuit obtained by combining the data on a plurality of circuits, and displaying the result of analysis obtained by analyzing the logic circuit differentiating the clock systems from each other, so that a trouble generated in a clock system portion in any of a plurality of blocks can clearly be identified from a logic circuit being designed, and a long time is not required for analyzing a cause for the trouble, and for this reason the work efficiency can be improved.

With the present invention, there are steps of combining data on a plurality of circuit, analyzing a clock system portion based on the logic circuit obtained by combining the data on the plurality of circuits, and displaying the result of analysis obtained by analyzing the logic circuit correlating each type of clock system to a corresponding clock input element, so that a trouble relating to a clock input element in a clock system portion in any of a plurality of blocks can clearly be identified from a logic circuit being designed, and a long time is not required for analyzing a cause for each trouble, and for this reason the work efficiency can be improved.

Other objects and features of this invention will become understood from the following description with reference to the accompanying drawings.

BRIEF DESCRIPTION OF THE DRAWINGS

FIG. 10 is a block diagram functionally showing a server constituting the computer-aided logic circuit designing system according to Embodiment 2;

FIG. 11 is a view showing an example of memory configuration in a circuit data integrating table for the server shown in FIG. 10;

FIG. 15 is a view showing one example of a result of analysis according to Embodiment 2;

FIG. 16 is a view showing another example of a result of analysis according to Embodiment 2;

FIG. 17 is a view showing another further example of a result of analysis according to Embodiment 2;

FIG. 18 is a view showing one example of an alarm according to Embodiment 2;

FIG. 19 is a view showing another example of an alarm of analysis according to Embodiment 2; and FIG. 20 is a view showing another further example of a result of analysis according to Embodiment 2.

DESCRIPTION OF THE PREFERRED EMBODIMENTS

Detailed description is made for the preferred embodiments of the computer-aided logic circuit designing apparatus, computer-aided logic circuit designing system, and computer-aided logic circuit designing method according to the present invention with reference to the accompanying drawings.

Figure 1:
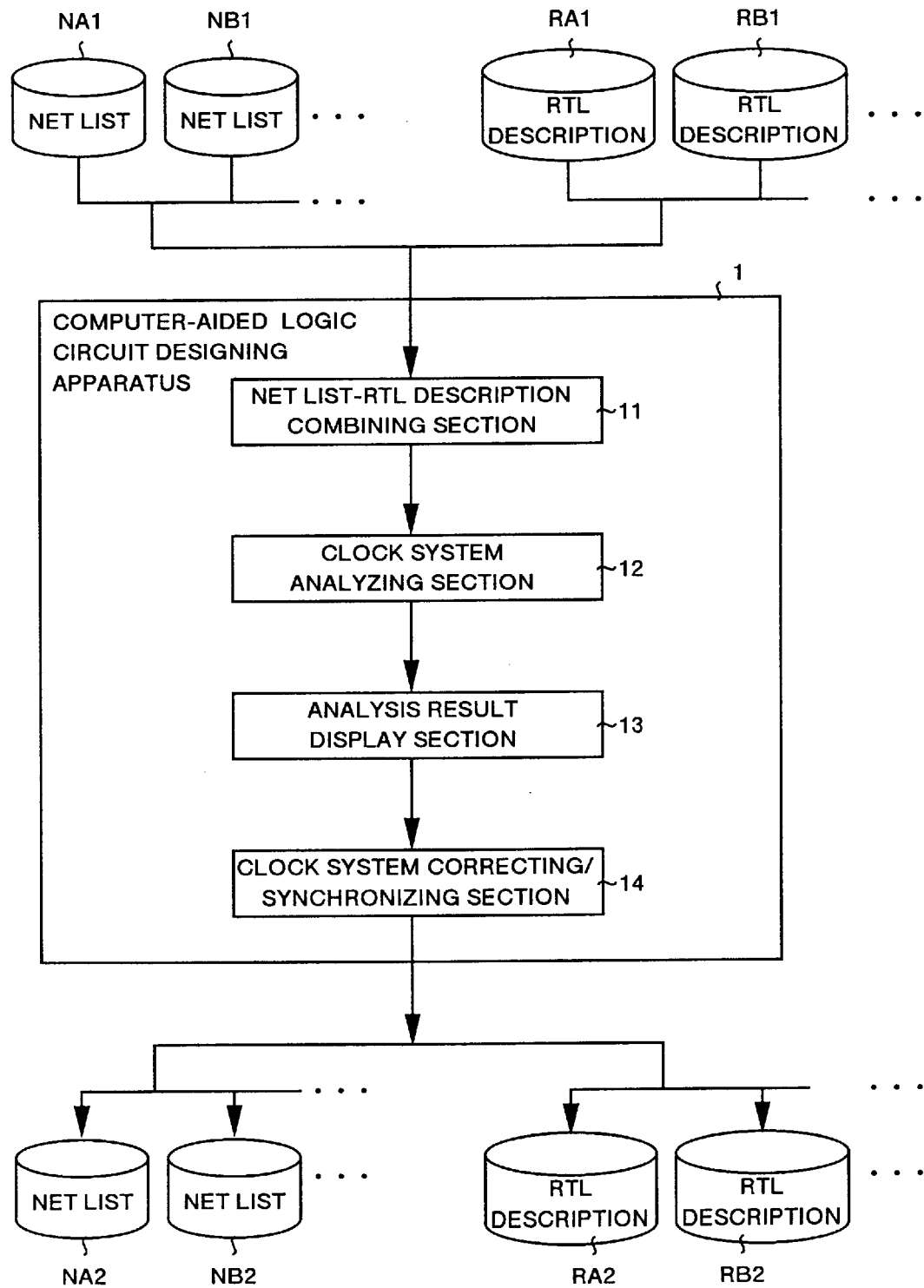
FIG. 1 is a block diagram functionally showing a computer-aided logic circuit designing apparatus according to Embodiment 1 of the present invention.

At first, description is made for the configuration from the functional point of view. FIG. 1 is a block diagram functionally showing a computer-aided logic circuit designing apparatus according to Embodiment 1 of the present invention. The computer-aided logic circuit designing apparatus shown in FIG. 1 comprises a net list-RTL description combining section 11, a clock system analyzing section 12, a analysis result display section 13, and a clock system correcting/synchronizing section 14.

The net list-RTL description combining section 11 obtains one unit of logic circuit by combining data on a logic circuit having a clock input element namely data on a plurality of net lists and data on a plurality of RTL description. The clock system analyzing section 12 analyzes a clock system portion based on the logic circuit obtained by combining the data by the net list-RTL description combining section 11. The analysis result display section 13 displays a result of analysis by the clock system analyzing section 12 so as to enable visual recognition thereof. The clock system correcting/synchronizing section 14 corrects troubles in the clock system and an asynchronous circuit portion based on the analysis result displayed on the analysis result display section 13.

With the configuration as described above, in the net list-RTL description combining section 11, net lists NA1, NB1, ... and RTL description RA1, RA2, ... each on a logic circuit having a clock input element are read out from a database, and are combined at an LSI chip level into one logic circuit. In the clock system analyzing section 12, a clock system portion is analyzed based on the logic circuit obtained by combining the data by the net list-RTL description combining section 11, and a result of analysis in which data for types of clock system, data on clock input elements (e.g. flip-flop, counter, latch), and warning data concerning troubled portions are correlated to each other is obtained. In this clock system analysis, an asynchronous circuit portion is also extracted from the logic circuit.

In the analysis result display section 13, a result of analysis by the clock system analyzing section 12 is visually displayed with the clock systems differentiated from each other. Expression by a text and visual expression with some colors may be employed for this display to get easy recognition. In the clock system correcting/synchronizing section 14, troubles in the clock system portion and an asynchronous circuit portion are corrected based on the result of analysis displayed on the analysis result display section 13, namely based on the data for types of clock system, data on clock input elements, and data for warning to troubled portions or the like.

It should be noted that warning is generated to an asynchronous circuit portion. In this clock system correcting/synchronizing section 14, the data for circuits after the correction (there is also a case where correction is not made) is returned again to the original form when the net lists and RTL description have been inputted. Net lists NA2, NB2, . . . correspond to the net lists NA1, NB1, . . . , respectively, and RTL description RA2, RB2, . . . correspond to the RTL description RA1, RB1, . . . , respectively.

Figure 2:
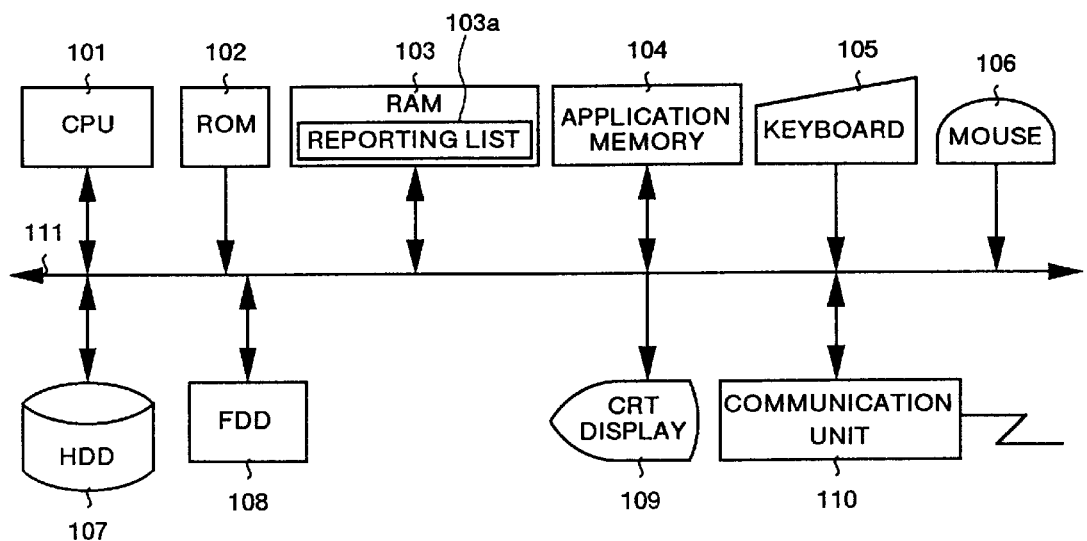
FIG. 2 is a block diagram showing hardware of the computer-aided logic circuit designing apparatus according to Embodiment 1 of the present invention.

Next description is made for the configuration from a point of hardware thereof. FIG. 2 is a block diagram showing hardware of the computer-aided logic circuit designing apparatus according to Embodiment 1 of the present invention. The computer-aided logic circuit designing apparatus shown in FIG. 2 has a CPU 101 connected to a bus 111, and units are connected to the CPU 101 via the bus 111 such as a ROM 102, a RAM 103, an application memory 104, a keyboard 105, a mouse 106, a hard disk drive (HDD) 107, a floppy disk drive (FDD) 108, a CRT display 109, and a communication unit 110.

The CPU 101 is a unit for providing controls over the entire apparatus according to various types of program and parameter stored in the ROM 102 and application memory 104 in order to perform functions in the net list-RTL description combining section 11, analysis result display section 13, and clock system correcting/synchronizing section 14. This CPU 101 operates mainly with the program according to the flow chart shown in FIG. 7 described later, and the functions shown in FIG. 1 are realized.

Further the CPU 101 provides controls over operations of reading/writing of data from/in each of the memories (ROM 102, RAM 103, application memory 104, HDD 107, FDD 108), operation and entry (keyboard 105, mouse 106), display of the data (CRT display 109), and data communication (communication unit 110).

The ROM 102 is a memory for storing therein programs and parameters which are different from applications such as an operating system. The RAM 103 has, in addition to a work area for operation by the CPU 101, a reporting list memory 103a for storing therein data as a reporting list for reporting a result of analysis obtained through analysis of a clock system to a user. The application memory 104 is a memory for storing therein the application program (program according to the flow chart show in FIG. 6) for performing the functions shown in FIG. 1.

The keyboard 105 has keys for operating therewith to enter the net list and data for RTL description stored and maintained in an external device or a database (e. g. HDD 107, FDD 108). The mouse 106 is a pointing device for entering a position of coordinates to the screen of the CRT display 109. The HDD 107, which corresponds to a database, has a hard disk inside the drive on which there is a high capacity memory for storing therein, for instance, the net list and data for RTL description. The FDD 108, which corresponds to a database, is a memory with a floppy disk detachably provided inside thereof for storing, for instance, net lists and data for RTL description on the disk.

The CRT display 109 is a color display unit corresponding to the analysis result display unit 13 shown in FIG. 1. A result of analysis is displayed as an object for displaying. The communication unit 110 is connected to a transmission line such as a local area network (LAN) and performs communications of net lists, data for RTL description and data for a result of analysis with the external unit through the transmission line. It should be noted that wire communications with the communication unit 110 are described by way of example in Embodiment 1, but if a radio unit is further mounted thereon, the same data as that through the wire communications can be transmitted through radio communications.

Figure 6:
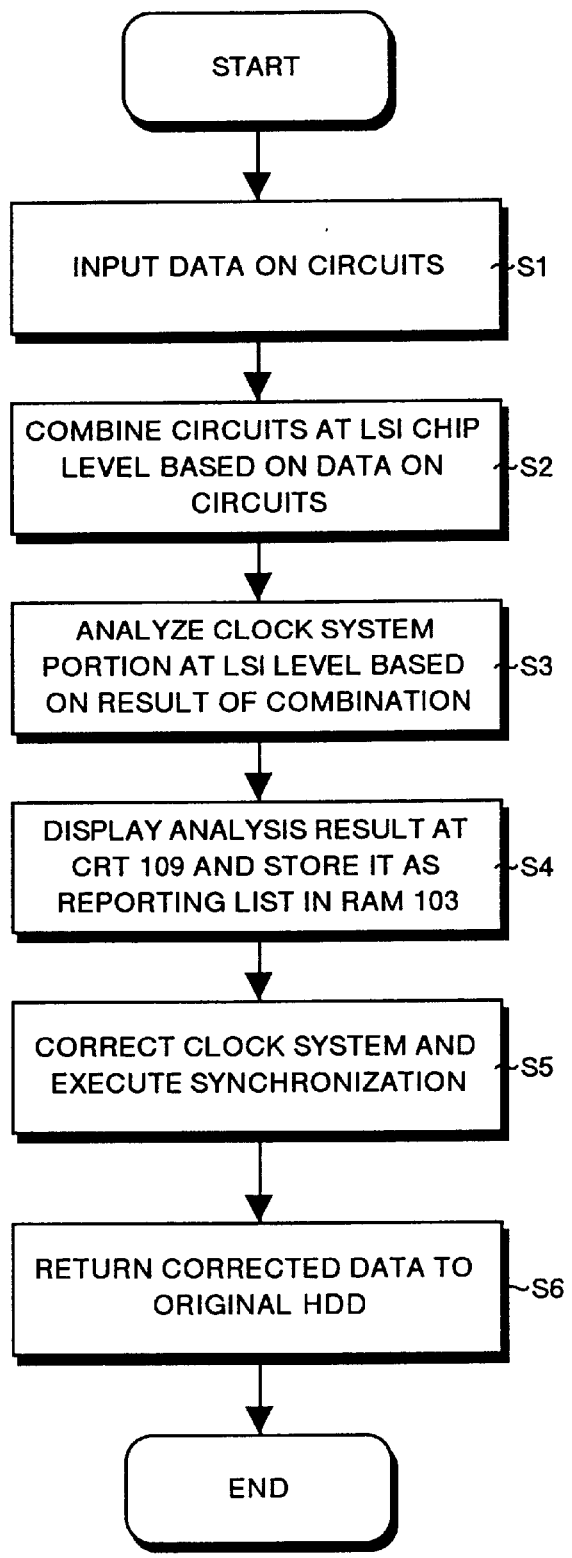
FIG. 6 is a flow chart for explaining operations according to Embodiment 1.
Figure 7:
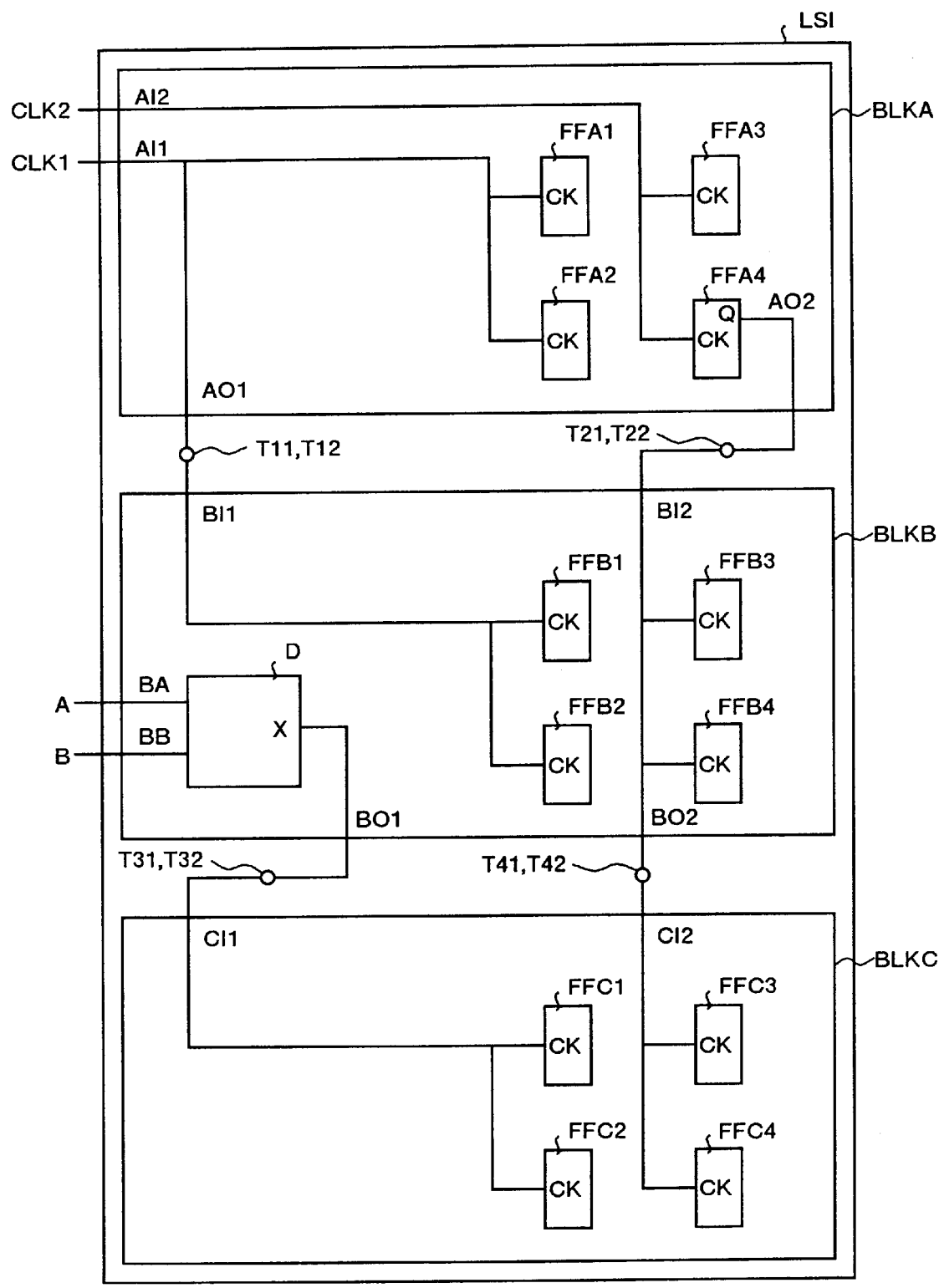
FIG. 7 is a view showing an example of display of a logic circuit obtained by combining the blocks each shown in FIG. 4, FIGS. 5A to 5C and FIG. 6 to one unit.
Figures 8, 9:
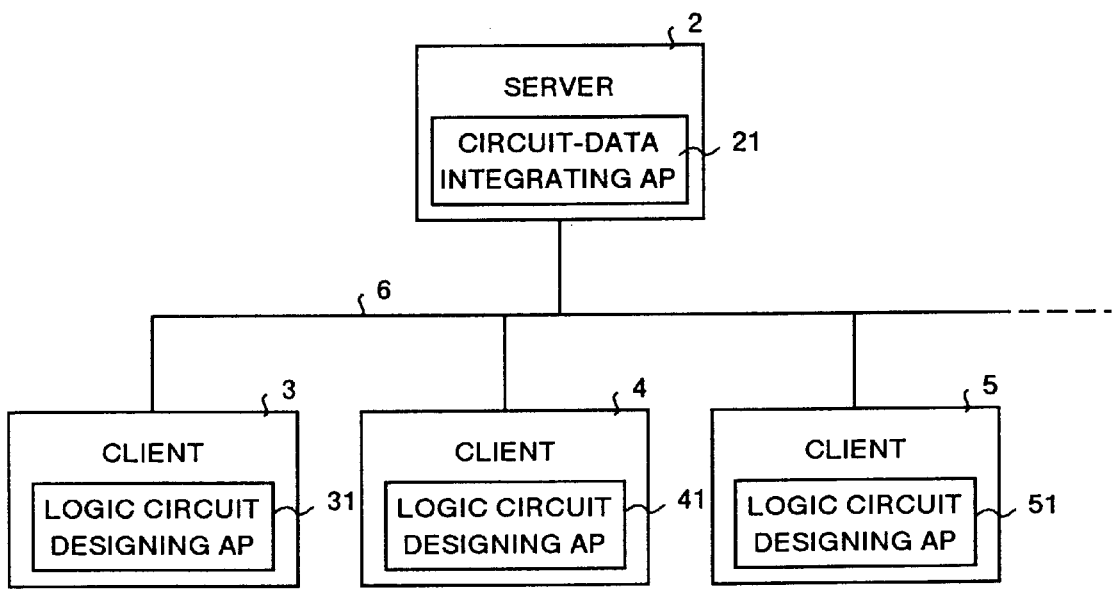
FIG. 8 is a view showing an example of display of a reporting list according to Embodiment 1.
FIG. 9 is a view of system configuration showing a computer-aided logic circuit designing system according to Embodiment 2 of the present invention.

Next description is made for operations. FIG. 3, FIG. 4 and FIGS. 5A to 5C are views each showing an example of display of a block of the logic circuit according to Embodiment 1 respectively, FIG. 6 is a flow chart for explaining operations according to Embodiment 1, FIG. 7 is a view showing an example of display of a logic circuit obtained by combining the blocks each shown in FIG. 3, FIG. 4 and FIGS. 5A to 5C to one unit, and FIG. 8 is a view showing an example of display of a reporting list according to Embodiment 1.

Figure 3:
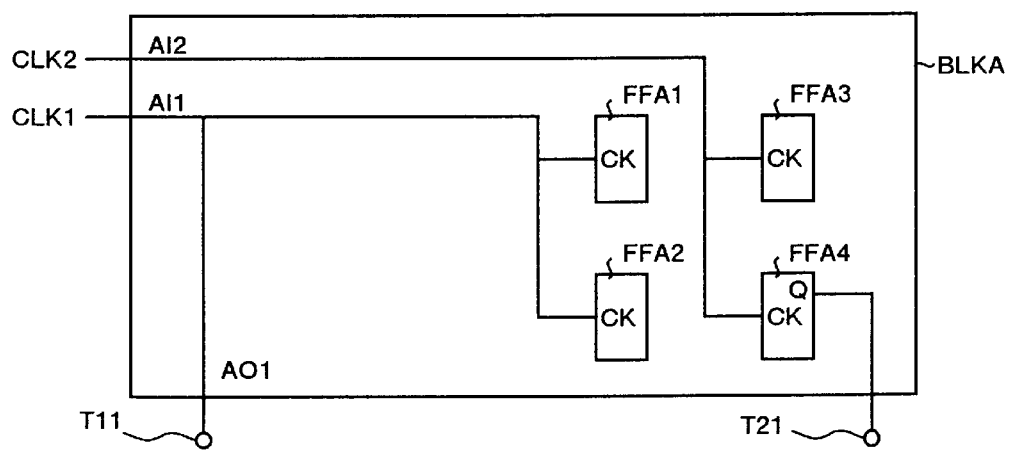
FIG. 3 is a view showing an example of display of one block of the logic circuit according to Embodiment 1.

Description is made hereinafter for a method of supporting a work for designing a logic circuit by combining the blocks each shown in FIG. 3, FIG. 4 and FIGS. 5A to 5C, respectively. FIG. 3 shows a first block BLKA obtained by combining four flip-flops FFA1, FFA2, FFA3, FFA4 as a clock system. In this first block BLKA, the flip-flops FFA1 and FFA2 are clock input elements each operating by receiving an input clock CLK1 (clock path AI1) respectively, and the flip-flops FFA3 and FFA4 are clock input elements each operating by receiving an input clock CLK2 (clock path AI2) respectively. The clock CLK1 (clock path AO1) is supplied from the first block BLKA to other block through a terminal T11, and an output Q (clock path AO2) from the flip-flop FFA4 is supplied through a terminal T21.

Figure 4:
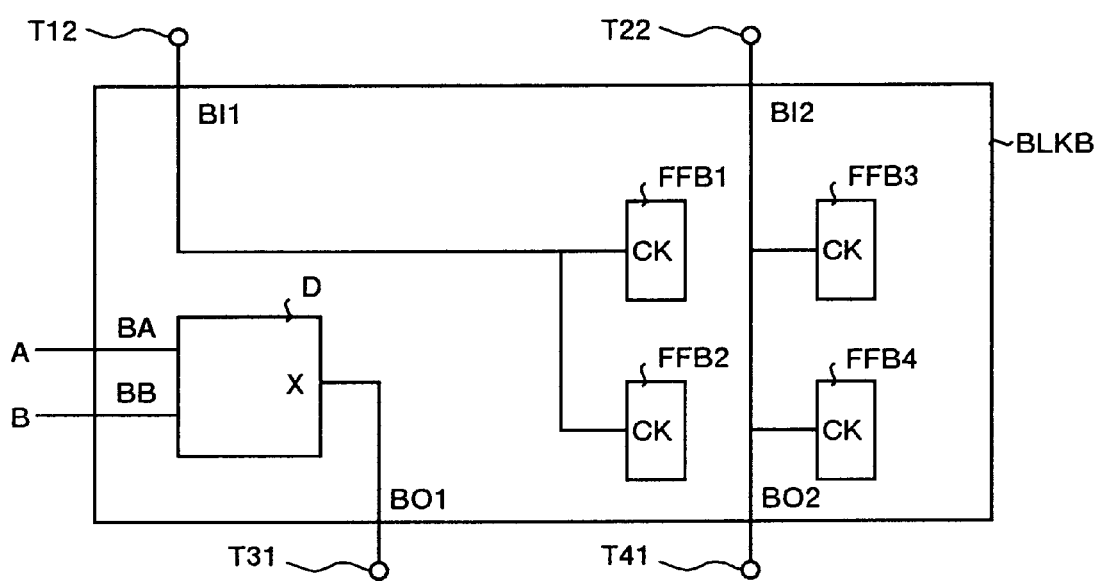
FIG. 4 is a view showing an example of display of another block of the logic circuit according to Embodiment 1.

FIG. 4 shows a second block BLKB obtained by combining four flip-flops FFB1, FFB2, FFB3, FFB4 as a clock system and providing therein a circuit D asynchronous to those flip-flops.

In this second block BLKB, the flip-flops FFB1 and FFB2 are clock input elements each operating by receiving a clock path AO1 (clock path BI1) supplied from the first block BLKA through a terminal T12, and the flip-flops FFB3 and FFB4 are clock input elements each operating by receiving the clock path AO2 (clock path BI2) supplied from the first block BLKA through a terminal T22. The circuit D generates an output X by receiving input clocks A, B from the outside. The output X (clock path BO1) from the circuit D is supplied from the second block BLKB to other block through a terminal T31, and a clock path BI2 (clock path BO2) is supplied through a terminal T41.

Figure 5A:
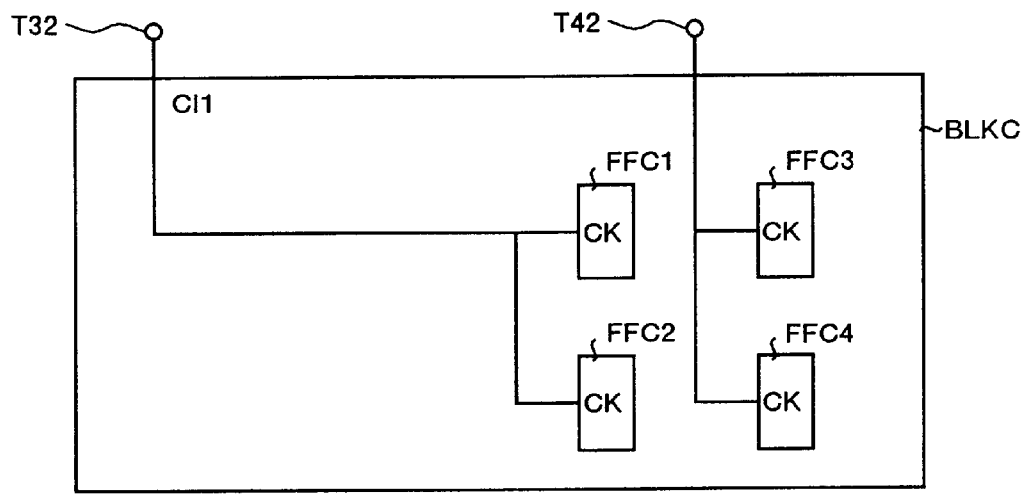
FIGS. 5A to 5C are views each showing an example of display of another further block of the logic circuit according to Embodiment 1.
Figure 5B:
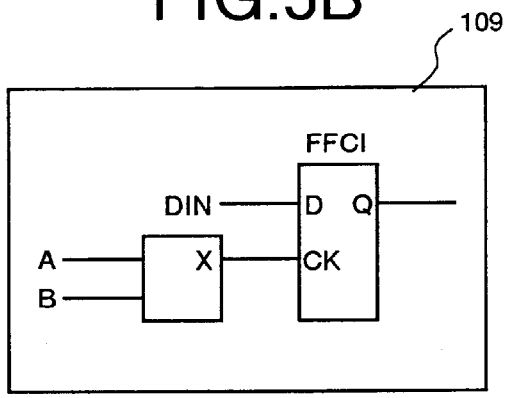

FIG. 5A shows a third block BLKC obtained by combining four flip-flops FFC1, FFC2, FFC3, FFC4 as a clock system. In this third block BLKC, the flip-flops FFC1 and FFC2 are clock input elements each operating by receiving the clock path BO1 (clock path CI1) supplied from the second block BLKB through a terminal T32, and the flip-flops FFC3 and FFC4 are clock input elements each operating by receiving the clock path BO2 (clock path CI2) supplied from the second block BLKB through a terminal T42.

When a unit of logic circuit is designed from the three blocks BLKA, BLKB and BLKC, if data on circuits (net list, RTL description) for constituting each of the blocks BLKA, BLKB and BLKC is stored in the HDD 107 or in the FDD 108, the data on circuits is read out from the HDD 107 or FDD 108 to be stored in the work area of the RAM 103 (step S1). Also, if the data on circuits is stored and maintained by external equipment on the transmission line connected to the communication unit 110, the data on circuits is received from the external equipment via the transmission line to be stored in the work area of the RAM 103.

When the data on circuits is stored in the work area of the RAM 103, circuits are then combined at an LSI chip level based on the data on circuits for the blocks (step S2). When the blocks are combined into one logic circuit as described above, as shown in FIG. 7, an LSI is formed in which the terminals T11, T12, T21 and T22 between the first block BLKA and second block BLKB are connected to each other and the terminals T31, T32, T41 and T42 between the second block BLKB and third block BLKC are connected to each other respectively.

Then, a clock system portion at the LSI chip level is analyzed based on a result of combination in step S2 (step S3). At first, the clock input elements are identified in each of the blocks BLKA, BLKB, and BLKC. As a result of the identification, the flip-flops FFA1, FFA2, FFA3 and FFA4 are extracted from the first block BLKA, the flip-flops FFB1, FFB2, FFB3 and FFB4 are extracted from the second block BLKB, and the flip-flops FFC1, FFC2, FFC3 and FFC4 are extracted from the third block BLKC.

After extraction of the clock input elements, each destination to which each clock terminal for clock input elements is connected is analyzed, and with this analysis each source of generated clocks can be specified. To describe more specifically, in the first block BLKA, the clock path AI1 is always inputted in clock terminals CK in either case of the flip-flops FFA1 and FFA2. Accordingly, an input clock CLK1 as an origin of the clock path AI1 is specified as a source for the generated clock.

Similarly, the clock path AI2 is always inputted in clock terminals CK in either case of the flip-flops FFA3 and FFA4. Accordingly, an input clock CLK2 as an origin of the clock path AI2 is specified as a source for the generated clock. Both of the input clocks CLK1 and CLK2 are clocks inputted from external terminals of the LSI, and the operation for specifying a source of the generated clock is executed up to an external terminal. It should be noted that this operation for specifying a source of the generated clock is executed up to an external terminal or an output terminal of a clock input element provided in the previous stage.

In the second block BLKB, the clock path BI1 is always inputted in clock terminals CK in either case of the flip-flops FFB1 and FFB2. An origin of the clock path BI1 is the clock path AO1 which is an external clock system of the second block BLKB. However, in this step, the operation for specifying a source of the generated clock has not yet reached detection of any external terminal of the LSI or an output terminal of the clock input element provided in the previous stage, so that the further operation for specification is executed in the order of the clock path AO1, clock path AI1, and input clock CLK1. As described above, the analysis in the clock system portion of the flip-flops FFB1 and FFB2 ends when the input clock CLK1 inputted to the external terminal of the LSI is specified.

Also, in the second block BLKB, the clock path BI2 is always inputted in clock terminals CK in either case of the flip-flops FFB3 and FFB4. An origin of the clock path BI2 is the clock path AO2 which is an external clock system of the second block BLKB. However, in this step, the operation for specifying a source of the generated clock has not yet reached to detection of any external terminal of the LSI or an output terminal of the clock input element provided in the previous stage, so that the further operation for specifying the source is executed in the order of the clock path AO2 and output Q. As described above, the analysis in the clock system portion of the flip-flops FFB3 and FFB4 ends when the output Q for the flip-flop FFA4 (clock input element) provided in the previous stage is specified.

In the third block BLKC, the clock path CI1 is always inputted into clock terminals CK in either case of the flip-flops FFC1 and FFC2. An origin of the clock path CI1 is the clock path BO1 which is an external clock system of the third block BLKC. However, in this step, the operation for specifying a source of the generated clock has not yet reached to detection of any external terminal of the LSI or an output terminal of the clock input element, so that the further operation for specifying the clock source is executed in the order of the clock path BO1, clock paths BA/BB, and input clocks A/B. As described above, when the input clocks A/B inputted to the external terminal of the LSI have been specified, analysis in the clock system portion of the flip-flops FFC1 and FFC2 ends.

Also, in the third block BLKC, the clock path CI2 is always inputted in clock terminals CK in either case of the flip-flops FFC3 and FFC4. An origin of the clock path CI2 is the clock path BO2 which is an external clock system of the third block BLKC.

However, in this step, the operation for specifying a source of the generated clock has not yet reached to detection of any external terminal of the LSI or an output terminal of the clock input element for execution provided in the previous stage, so that the further operation for specifying the clock source is executed in the order of the clock path BO2, clock path BI2, clock path AO2, and output Q for the flip-flop FFA4. As described above, the analysis in the clock system portion of the flip-flops FFC3 and FFC4 ends when the output Q for the flip-flop FFA4 (clock input element) is specified.

A result of analysis shown in FIG. 8 is obtained through this clock system analysis, the analysis result is displayed on the CRT display 109 as a reporting list to the designer, and at the same time stored in the reporting list memory 103a of the RAM 103 (step S4). Namely, the clocks include three types: the input clocks CLK1 and CLK2; the output Q of the flip-flop FFA4; and the input clocks A and B. Those types of clock are correlated to clock input elements respectively.

Namely, correlated to the input clock CLK1 are the flip-flops FFA1, FFA2 through the clock path AI1, and are also the flip-flops FFB1, FFB2 through the clock paths AO1 and BI1. Only one type of clock is supplied from the external terminal for each clock type for the clock path AI1, clock paths AO1 and BI1, and for this reason conditions of the clock system are regarded as acceptable.

Correlated to the input clock CLK2 are the flip-flops FFA3, FFA4 through the clock path AI2. Only one type of clock is supplied from the external terminal for each clock type for the clock path AI2, and for this reason conditions of the clock system are regarded as acceptable.

Correlated to the output Q for the flip-flop FFA4 are the flip-flops FFB3, FFB4 through the clock paths AO2 and BI2, and are also the flip-flops FFC3, FFC4 through the clock paths BO2 and CI2. As for each clock type for the clock paths AO2 and BI2, and clock paths BO2 and CI2, one type of clock is supplied from the LSI internal circuit (flip-flop FFA4), and for this reason the clock system is regarded as an object for warning as far as the conditions are concerned. Namely, it is assumed herein that a clock system is supplied from the outside of the LSI.

Correlated to the input clocks A/B are the flip-flops FFC1, FFC2 through the clock paths BA/BB, BO1 and CI1. As for each clock type for the clock paths BA/BB, BO1 and CI1, clocks are supplied from a plurality of external terminals (A, B), and for this reason the clock system is regarded as an object for warning as far as the conditions are concerned. Namely, it is assumed herein that only one clock system is supplied from the outside of the LSI.

In the example shown in FIG. 8, warning is issued for the clock system for supplying a clock from the internal circuit of an LSI namely from the flip-flop FFA4. The warning is issued because hazards may be generated when a clock is supplied from the internal circuit of the LSI. Further, warning is issued to the clock system for supplying clocks from a plurality of external terminals. The warning is issued because an asynchronous state may be generated when a plurality of clocks is generated from the plurality of external terminals. In this case, it is required to correct and synchronize the clock system.

A designer can immediately know the necessity of correcting the clock system as well as the necessity of synchronizing the asynchronous circuit from the contents of warning displayed on the CRT display 109. Then, when a clock system is to be corrected, the clock system in the flip-flops FFB3, FFB4, FFC3, and FFA4 may be corrected, and when synchronization is to be executed, a clock system in the circuit D corresponding to the asynchronous circuit portion may be synchronized (step S5). Any of the operations described above may be executed using the keyboard 105 and mouse 106.

When any of the clock input elements, as shown in FIG. 8, such as flip-flops FFB3, FFB4, FFC3, FFC4, FFC1 and FFC2 in the warned clock system is selected through the keyboard 105 or the mouse 106, a circuit diagram (RTL description) based on the data (net list and RTL description) on the circuit in the selected clock input element is displayed on the CRT display 109. Then, when any clock system that the operator wants to change in the displayed circuit diagram is specified by means of the keyboard 105 or the mouse 106, the processing for changing the circuit to a circuit equivalent to the original circuit is executed.

Figure 5C:
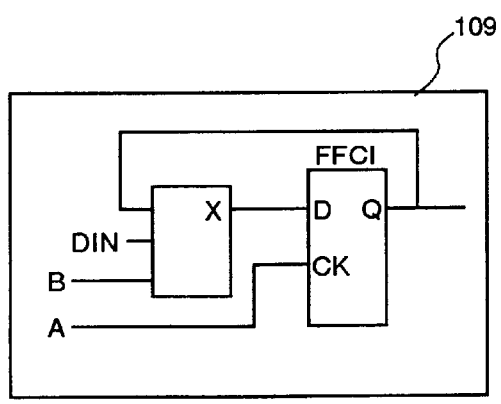

Herein it is assumed, for instance, that the designer specifies the flip-flop FFC1 among the input elements in the warned clock system in FIG. 8. Then, the CRT display 109 displays thereon the circuit diagram shown in FIG. 5B. Further, when the designer specifies "A" as a clock system to be changed, the original circuit is changed to an equivalent circuit as shown in FIG. 5C.

As described above, when the processing for correction (processing for correcting and synchronizing a clock system) is complete, the net list and RTL description are changed according to the contents of the correction in order to reflect a result of the correction to the inputted data on the circuit, and the corrected data is returned to the original HDD 107, FDD 108 or to an external unit (step S6).

As described above, with Embodiment 1, data on a plurality of circuits is stored in a database such as the HDD 107 and FDD 108, the data on a plurality of circuits is read out therefrom and combined, a clock system portion is analyzed based on the logic circuit obtained by combining the data, and a result of the analysis is displayed on the CRT display 109 correlating a clock input element to each type of clock system. With those operations, a trouble relating to a clock input element in a clock system portion of any of a plurality of blocks can clearly be identified from a logic circuit being designed, and a long time is not required for analyzing a cause for the trouble even if a portion or all of old resources is used, and for this reason the work efficiency can be improved.

Data on each circuit is corrected by operating a device such as the keyboard 105 and mouse 106 based on a result of analysis displayed on the CRT display 109, so that a work for correcting the trouble can immediately be started after analysis, and for this reason the work efficiency can be improved.

An asynchronous circuit portion is extracted from the logic circuit through analysis of a clock system, and an alarm concerning the extracted asynchronous circuit portion is generated when displaying the result of analysis, so that the asynchronous circuit portion is clearly identified through the analysis of a clock system and a long time is not required for analyzing a cause for the trouble even in not only the clock system but also the asynchronous circuit portion, and for this reason the work efficiency can be improved.

The data on each circuit is corrected based on a result of analysis displayed on the CRT display 109 to evade hazards in a clock system and for synchronization for an asynchronous circuit portion, so that a work for correcting the trouble in the clock system portion and the asynchronous circuit portion can immediately be started after analysis, and for this reason the work efficiency can be improved.

The analysis result in which data for types of clock system, data on clock input elements, and warning data concerning troubles in clock systems are correlated to each other is obtained through analysis of the clock system, so that a state of the clock system obtained through analysis of the clock system can easily be checked on the whole.

A clock path for each type of clock system is further correlated to data for types of clock system, data on clock input elements, and warning data concerning troubles in clock systems, so that a state of combining clock paths between blocks can easily be checked.

In Embodiment 1, description has been made for a unit of computer-aided logic circuit designing apparatus, but in like Embodiment 2 described hereinafter, the computer-aided logic circuit designing described in Embodiment 1 may be realized by a network system with a server and clients connected to each other thereon.

At first, description is made for the system configuration. FIG. 9 is a view showing system configuration of a computer-aided logic circuit designing system according to Embodiment 2 of the present invention. The computer-aided logic circuit designing system shown in FIG. 9 comprises a server 2, and clients 3, 4, 5, . . . each connected to the identical network 6.

The server 2 has a circuit-data integrating application (AP) 21, and receives, by executing this circuit-data integrating AP 21, data on circuits (net lists, RTL description) for designing described in Embodiment 1 from the clients 3, 4, 5, ..., combines circuits at an LSI chip level and analyzes a clock system, and transfers a result of the analysis as a reporting list to each of the clients 3, 4, 5, . . . via the network 6.

Each of the clients 3, 4, 5, . . . has each of logic circuit designing applications (AP) 31, 41, 51, . . . respectively. The clients 3, 4, 5, . . . transfer, by executing the logic circuit designing APs 31, 41, 51, . . . , respectively, data on circuits (net lists, RTL description) for designing described in Embodiment 1 to the server 2 via the network 6, receive the reporting lists, and correct data on circuits (correct the clock system and execute synchronization) according to the reporting lists respectively.

Next description is made for the server 2 constituting the computer-aided logic circuit designing system. FIG. 10 is a block diagram functionally showing the server constituting the computer-aided logic circuit designing system according to Embodiment 2. It should be noted that configuration of hardware for the server 2 may be obtained only by adding a LAN unit for a network to the configuration shown in FIG. 2, so that the figure and description thereof are omitted herein.

FIG. 10 shows block configuration in the server 2 when the circuit data integrating AP 21 is executed using the CPU not shown in the figure. Namely, the server 2 comprises a circuit data input section 23, a circuit data combining section 24, a clock system analyzing section 25 and an analysis result reporting section 26 each provided for performing functions according to the circuit-data integrating AP 21, as well as a circuit data integrating table 22.

The circuit data input section 23 receives data on circuits (net lists, RTL description) from the clients 3, 4, 5, . . . via the network 6 and stores the inputted data on circuits in the circuit data integrating table 22. The circuit data combining section 24 combines circuits each at an LSI chip level based on the data on circuits (data on circuits inputted by the circuit data input section 23 or data on circuits having been stored in the circuit data integrating table 22) inputted from the clients 3, 4, 5, . . . to obtain one logic circuit.

The clock system analyzing section 25 analyzes a clock system at the LSI chip level based on the logic circuit obtained by combining the circuits by the circuit data combining section 24, obtains a correlation among data for types of clock system, data on clock input elements and warning data concerning troubles as a result of analysis, and stores the result of analysis in the circuit data integrating table 22 by being prepared for each of the clients 3, 4, 5, . . . . The analysis result reporting section 26 transfers the analysis result as a reporting list to each of the clients 3, 4, 5, . . . via the network 6.

The circuit data integrating table 22 stores therein data on circuits comprising a net list and data for RTL description correlated to a result of analysis for each client.

Description is made here for the circuit data integrating table 22. FIG. 11 is a view showing an example of memory configuration in the circuit data integrating table 22 for the server 2 shown in FIG. 10. Description is made hereinafter for a case where a unit of LSI obtained by sharing blocks by the clients 3, 4, 5 is designed. The circuit data integrating table 22 stores therein, as shown in FIG. 11, each data on circuit CIRA, CIRB, CIRC and results of analysis RESA, RESB, RESC correlated to each other respectively for each of the clients 3, 4, and 5.

Figure 12:
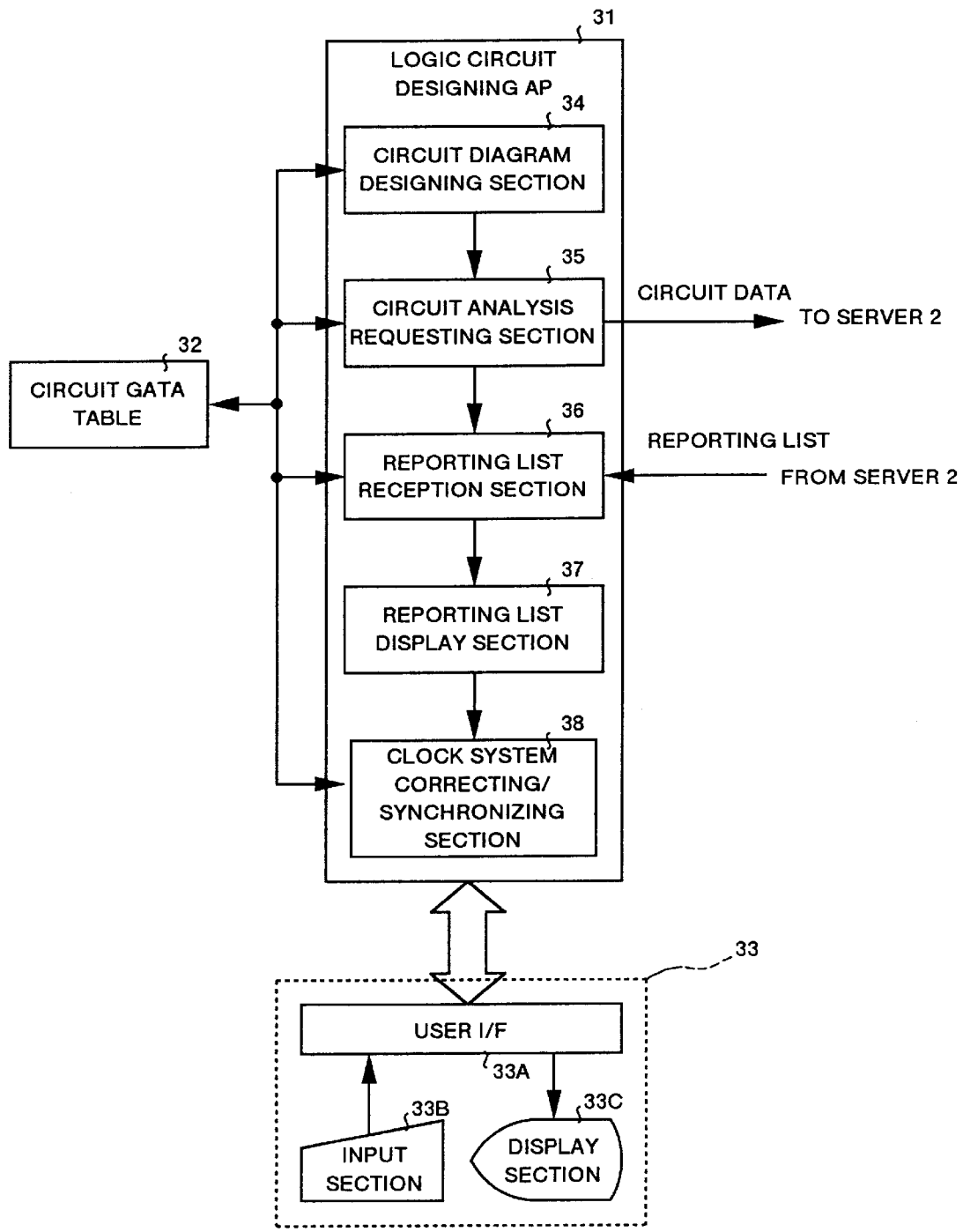
FIG. 12 is a block diagram functionally showing a client constituting the computer-aided logic circuit designing system according to Embodiment 2.

Next description is made for the clients 3, 4 and 5 constituting the computer-aided logic circuit designing system described above. The client 3 is taken up herein as an example for description as a representative of the clients. FIG. 12 is a block diagram functionally showing the client 3 constituting the computer-aided logic circuit designing system according to Embodiment 2. It should be noted that hardware configuration of the client 3 may be obtained only by adding a LAN unit for a network to the configuration shown in FIG. 2, so that the figure and description thereof are omitted herein.

FIG. 12 shows block configuration in the client 3 when a logic circuit designing AP 31 is executed using the CPU not shown in the figure. Namely, the client 3 comprises a circuit diagram designing section 34, a circuit analysis requesting section 35, a reporting list reception section 36, a reporting list display section 37 and a clock system correcting/synchronizing section 38 each provided for performing functions according to the logic circuit designing AP 31; a circuit data table 32; and a user interface section 33.

The circuit diagram designing section 34 designs, through the user I/F section 33, a logic circuit using hardware description language (HDL) for designing a circuit on a computer system by means of an abstract description method such as a register transfer level RTL or the like, and stores data on the designed logic circuit in the circuit data table 32. The circuit analysis requesting section 35 sends a request (data on the circuit is simultaneously transferred) for analysis of a clock system concerning the data on the logic circuit designed by the circuit diagram designing section 34 to the server 2 via the network 6.

The reporting list reception section 36 receives a reporting list (a result of analysis) sent from the server 2 after request for analysis of a clock system from the circuit analysis requesting section 35, and stores the reporting list in the circuit data table 32. The reporting list display section 37 displays the reporting list received by the reporting list reception section 36 so as to enable visual recognition thereof. The clock system correcting/synchronizing section 38 corrects troubles in a clock system and an asynchronous circuit portion based on the reporting list displayed on the reporting list display section 37, and at the same time updates the contents of the circuit data table 32 based on a result of the correction.

The circuit data table 32 stores therein data on circuits comprising net lists and data for RTL description, and a reporting list (result of analysis) correlated to each other. The user I/F section 33 connects an input section 33B such as a keyboard and a mouse to a display section 33C such as a CRT display or an LCD display for the logic circuit designing AP 31 via the user I/F 33A.

Figure 13:
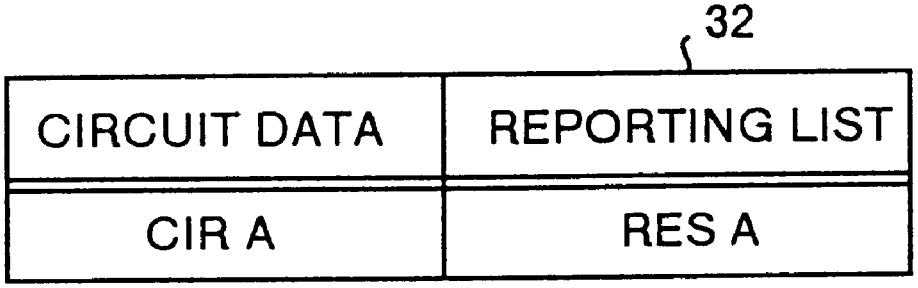
FIG. 13 is a view showing an example of memory configuration for a circuit data table in the client shown in FIG. 12.

Description is made herein for the circuit data table 32. FIG. 13 is a view showing an example of memory configuration for the circuit data table 32 in the client 3 shown in FIG. 12. The circuit data table 32 stores therein, as shown in FIG. 13, data on a circuit CIRA and a reporting list RESA correlated to each other.

Figure 14:
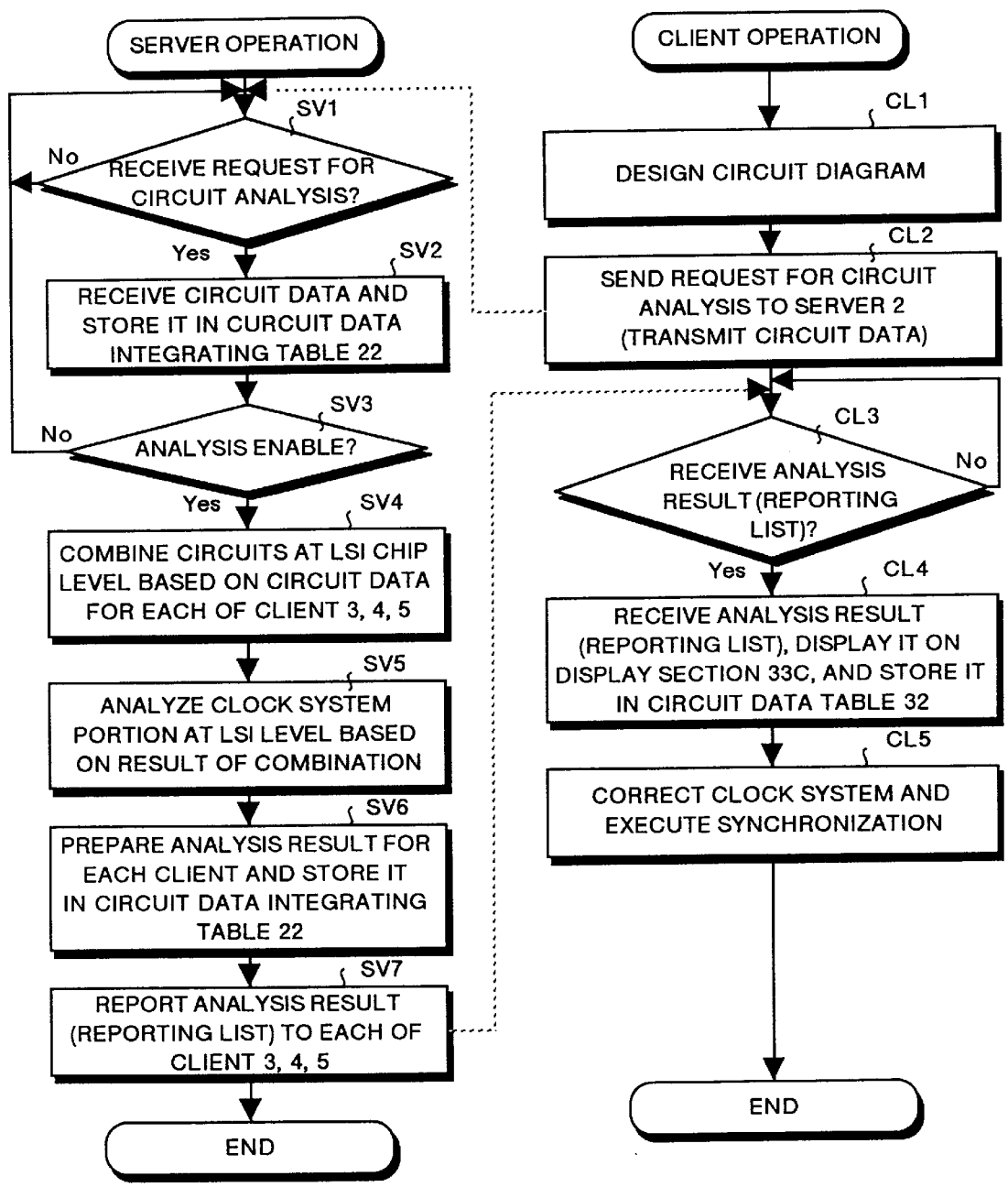
FIG. 14 is a flow chart for explaining operations according to Embodiment 2.

Next description is made for operations. FIG. 14 is a flow chart for explaining the operations according to Embodiment 2, and FIG. 15 to FIG. 17 are views each showing an example of a result of analysis according to Embodiment 2. In the description made hereinafter, server processing indicates an operation by the server 2, and client processing indicates an operation by each of the clients 3, 4 and 5.

At first, a circuit diagram is designed in each of the clients 3, 4 and 5 (step CL1). This circuit diagram designing is executed, for instance, by the circuit diagram designing section 34 in the client 3 through the user I/F section 33 thereof. When the designing is executed, as one example, it is assumed that the first block BLKA (Refer to FIG. 3), second block BLKB (Refer to FIG. 4), and third block BLKC (Refer to FIG. 5A) each described above are designed in the clients 3, 4 and 5.

Each of the clients 3, 4 and 5 sends, when the designing work reaches a step where analysis of a clock system can be executed, a request for circuit analysis is sent to the server 2. At this point of time, circuit data on the logic circuit designed by each of the clients 3, 4 and 5 is added to the request and sent to the server 2 (step CL2). At the same time, each of the clients 3, 4 and 5 stores circuit data on each of the blocks in the circuit data table for the device. Then, when the request for circuit analysis is received by the server 2 (step SV1), the server 2 receives data on the circuit from the originating client, and stores the data on the circuit correlated to a type of the originating client (indicating differentiation of the clients 3, 4, 5 from each other) in the circuit data integrating table 22 (step SV2).

Analysis of a clock system in the server 2 requires as preconditions that data on circuits has been received from all of the clients 3, 4 and 5 and the work for designing the circuit has reached the step where a clock system can be analyzed with all the circuit data. For this reason, the server 2 makes determination, only when the conditions are satisfied, that analysis of the clock system can be executed (step SV3), and the processing is shifted to the processing for analyzing the clock system (from step SV4 and on). It should be noted that, if analysis of the clock system can not be executed, the processing returns again to step SV1. At this point of time, if the reason why the conditions above are not satisfied is reported to the originating client, the client can know how other designers are doing their designing works and what is short in the data on the circuit being designed by the client.

When the processing shifts to step SV4, circuits are combined at the LSI chip level based on the circuit data for each of the blocks (each of the clients 3, 4, 5). As described above, when the blocks are combined into one logic circuit, as shown in FIG. 7, an LSI is formed in which the terminals T11, T12, T21 and T22 between the first block BLKA and second block BLKB are connected to each other and the terminals T31, T32, T41 and T42 between the second block BLKB and third block BLKC are connected to each other respectively.

Then, a clock system portion at the LSI chip level is analyzed based on a result of combination in step SV4 (step SV5). The processing for this analysis is executed in the same method as that in Embodiment 1. Namely, clock input elements are identified in each of the blocks BLKA, BLKB, and BLKC. As a result of the identification, the flip-flops FFA1, FFA2, FFA3 and FFA4 are extracted from the first block BLKA, the flip-flops FFB1, FFB2, FFB3 and FFB4 are extracted from the second block BLKB, and the flip-flops FFC1, FFC2, FFC3 and FFC4 are extracted from the third block BLKC.

In the first block BLKA, the clock path AI1 is always inputted into the clock terminal CK in either case of the flip-flops FFA1 and FFA2. Accordingly, an input clock CLK1 as an origin of the clock path AI1 is specified as a source for the generated clock. Similarly, the clock path AI2 is always inputted into clock terminal CK in either case of the flip-flops FFA3 and FFA4. Accordingly, an input clock CLK2 as an origin of the clock path AI2 is specified as a source for the generated clock.

In the second block BLKB, the clock path BI1 is always inputted into the clock terminal CK in either case of the flip-flops FFB1 and FFB2. An origin of the clock path BI1 is the clock path AO1 which is an external clock system of the second block BLKB, but the further operation for specification is executed in the order of the clock path AI1 and input clock CLK1. As described above, the input clock CLK1 inputted to the external terminal of the LSI is specified.

Also, in the second block BLKB, the clock path BI2 is always inputted into the clock terminal CK in either case of the flip-flops FFB3 and FFB4. An origin of the clock path BI2 is the clock path AO2 which is an external clock system of the second block BLKB, but the further operation for specification is executed for the output Q thereafter. As described above, the output Q for the flip-flop FFA4 (clock input element) provided in the previous stage is specified.

In the third block BLKC, the clock path CI1 is always inputted into the clock terminal CK in either case of the flip-flops FFC1 and FFC2. An origin of the clock path CI1 is the clock path BO1 which is an external clock system of the third block BLKC, but the further operation for specification is executed in the order of the clock paths BA/BB and input clocks A/B. As described above, the input clocks A/B inputted to the external terminal of the LSI are specified.

Also, in the third block BLKC, the clock path CI2 is always inputted into the clock terminal CK in either case of the flip-flops FFC3 and FFC4. An origin of the clock path CI2 is the clock path BO2 which is an external clock system of the third block BLKC, but the further operation for specification is executed in the order of the clock path BI2, clock path AO2, and output Q for the flip-flop FFA4. As described above, the output Q for the flip-flop FFA4 (clock input element) is specified.

The result of analysis shown in FIG. 8 is obtained through this clock system analysis, the analysis result is prepared for each of the clients 3, 4 and 5, and each of the result is each of the contents of the reporting lists RESA, RESB and RESC shown in FIG. 15, FIG. 16, and FIG. 17 respectively. Those reporting lists RESA, RESB and RESC are stored in the circuit data integrating table 22 correlated to types of client (step SV6).

It should be noted that a result of analysis prepared for each client namely a reporting list is provided, if there is any clock system concerning other block, as data for a type of clock concerning the clock system correlated to a clock input element. Then data for warning (W) is added to a clock system and an asynchronous circuit portion each required for warning.

In FIG. 15, the reporting list RESA shows a result of analysis in the client 3. A type of clock in this reporting list RESA includes four types: the input clock CLK1, input clock CLK2, clock path AO1, and clock path AO2. Concerning the clock input elements correlating to types of clock (clock paths), the flip-flops FFA1, FFA2 correlate to the input clock CLK1, and the flip-flops FFA3, FFA4 correlate to the input clock CLK2, while the flip-flops FFB1, FFB2 correlate to the clock path AO1, and the flip-flops FFB3, FFB4 correlate to the clock path AO2.

Then, a clock (output Q for the flip-flop FFA4) supplied from the LSI internal circuit is employed for the flip-flops FFB3, FFB4 in other block (the second block BLKB) connected to the clock path AO2, and for this reason the condition in each of the flip-flops FFB3, FFB4 is an object (W) for warning.

In FIG. 16, the reporting list RESB shows a result of analysis in the client 4. A type of clock in this reporting list RESB includes four types: the input clock CLK1, output Q for the flip-flop FFA4, clock path BO2, and clock path BO1. Concerning the clock input elements correlating to types of clock (clock paths), the flip-flops FFB1, FFB2 correlate to the input clock CLK1, and the flip-flops FFB3, FFB4 correlate to the output Q for the flip-flop FFA4, while the flip-flops FFC3, FFC4 correlate to the clock path BO2, and the flip-flops FFC1, FFC2 correlate to the clock path BO1.

Then, a clock (output Q for the flip-flop FFA4) supplied from the LSI internal circuit is employed for the flip-flops FFC3, FFC4 in other block (the third block BLKC) connected to the clock path BO2, and for this reason the condition in each of the flip-flops FFC3, FFC4 is an object (W) for warning. Further, clocks are supplied from a plurality of external terminals (A, B) to the flip-flops FFC1, FFC2 in other block (the third block BLKC) connected to the clock path BO1, and for this reason the condition in this clock system is an object (W) for warning.

In FIG. 17, the reporting list RESC shows a result of analysis in the client 5. A type of clock in this reporting list RESC includes two types: the input clocks A/B and output Q for the flip-flop FFA4. Concerning the clock input elements correlating to types of clock, the flip-flops FFC1, FFC2 correlate to the input clock A/B, and the flip-flops FFC3, FFC4 correlate to the output Q for the flip-flop FFA4.

Then, clocks are supplied from the plurality of external terminals (A, B) to the flip-flops FFC1, FFC2 in the block of the device (third block BLKC) connected to the input clocks A/B, and for this reason the condition in this clock system is an object (W) for warning. Further, a clock (output Q for the flip-flop FFA4) supplied from the LSI internal circuit is employed for the flip-flops FFC3, FFC4 in the block (the third block BLKC) of the device connected to the output Q for the flip-flop FFA4, and for this reason the condition in each of the flip-flops FFC3, FFC4 is an object (W) for warning.

Then, a result of analysis for each client is transferred to each designer of the clients 3, 4 and 5 as a reporting list via the network 6 (step SV7). When each report of analysis results namely each reporting list is transferred from the server 2 to each of the clients 3, 4 and 5 (step CL3), each of the clients 3, 4 and 5 receives the reporting list, displays it on the display section (display section 33C in a case of the client 3), and stores it in the circuit data table (circuit data table 32 in a case of the client 3) (step CL4).

In the example shown in FIG. 8, warning is issued to the clock system for supplying a clock from the internal circuit of an LSI namely from the flip-flop FFA4. The warning is issued because hazards may be generated when a clock is supplied from the internal circuit of the LSI. Further, warning is issued to the clock system for supplying clocks from a plurality of external terminals. The warning is issued because there may be a possibility of an asynchronous circuit when a plurality of clocks are generated from the plurality of external terminals. In this case, correction and synchronization of the clock system are required.

Each designer for the clients 3, 4 and 5 can immediately recognize the necessity of correcting the clock system as well as the necessity of synchronizing the asynchronous circuit from the contents of warning displayed on the display section (display section 33C in a case of the client 3). Then, when the clock system is to be corrected, the clock system in the flip-flops FFB3, FFB4, FFC3, and FFA4 maybe corrected, and when synchronization is to be executed, the clock system in the circuit D corresponding to an asynchronous circuit portion may be synchronized. Any of the operations may be executed using the input section (input section 33B in the case of the client 3).

When the processing for correction (processing for correction and synchronization of the clock system) is finished in each of the clients 3, 4 and 5, the net list and RTL description are changed according to the contents of the correction in order to reflect a result of the correction to the data on circuits stored in the circuit data table for the device (circuit data table 32 in a case of the client 3) (step CL5).

As described above, with Embodiment 2, each of the clients 3, 4 and 5 designs data on a circuit having one or a plurality of clock input elements each constituting a clock system portion, sends a request for analysis of data on the designed circuit to the server 2, and displays a result of analysis reported, after a request for analysis, from the server 2 correlating a clock input element to each type of clock system. While the server 2 combines data on circuits sent from the plurality of clients 3, 4 and 5, respectively, analyzes a clock system portion based on the logic circuit obtained by combining the data, and reports the result of analysis to the plurality of clients 3, 4 and 5.

With those operations, the server 2 can centralize management of troubles concerning a clock input element in the clock system portion in any of the plurality of blocks from a logic circuit being designed in each client 3, 4 and 5, and there is no load to analyze a cause for the trouble by the client sides 3, 4 and 5, and for this reason the work efficiency in the entire system can be improved.

Each of the clients 3, 4 and 5 corrects the data on the circuit based on the displayed analysis result, so that a work for correcting the trouble can immediately be started in each of the client 3, 4 and 5 after analysis by the server 2, and for this reason the work efficiency can be improved.

An asynchronous circuit portion is extracted from the logic circuit by means of clock system analysis in the server 2, and when displaying the result of analysis in each of the client 3, 4 and 5, an alarm for the extracted asynchronous circuit portion is generated, so that the asynchronous circuit portion is clearly identified through the analysis of a clock system and a long time is not required for analyzing a cause for the trouble even in not only the clock system but also the asynchronous circuit portion in each of the clients 3, 4 and 5, and for this reason the work efficiency can be improved.

Each of the clients 3, 4 and 5 corrects the data for each circuit to evade hazards for a clock system portion or the data for each circuit for synchronization for the asynchronous circuit portion based on the displayed result of analysis, so that a work for correcting the trouble in the clock system portion and the asynchronous circuit portion can immediately be started in each of the clients 3, 4 and 5 after analysis by the server 2, and for this reason the work efficiency can be improved.

The analysis result in which data for types of clock system, data on clock input elements, and warning data concerning troubles in clock systems are correlated to each other is obtained through analysis of the clock system by the server 2, so that a state of the clock system obtained through analysis of the clock system can easily be checked on the whole in the server 2.

The server 2 further correlates a clock path for each type of clock to data for types of clock system, data on clock input elements, and warning data concerning troubles in clock systems, so that a state of combining clock paths between blocks can easily be checked in each of the clients 3, 4 and 5.

In Embodiment, only contents of the reporting lists (Refer to FIG. 15, FIG. 16 and FIG. 17) displayed as they are in each of the clients 3, 4 and 5 is data sufficient to know a state of clock systems, but massages each indicating advice on a solution to the contents of a reporting list may further be displayed. Concrete description is made for the message with reference to FIG. 18, FIG. 19 and FIG. 20.

FIG. 18, FIG. 19 and FIG. 20 are views each showing an example of a reporting list according to the modification of Embodiment 2. In FIG. 19 and FIG. 20, the reference numeral 43C indicates a display section provided in the client 4, and the reference numeral 53C indicates a display section provided in the client 5. In the modification, a screen for displaying only warning thereon is formed through operation of the input section (input section 33B in a case of the client 3) after the reporting list is displayed. Namely, the case of the client 3 shows that the clock path AO2 in the clock type has a problem as shown in FIG. 15, therefore only the clock type and the clock input element having the problem are displayed as shown in FIG. 18, and there is provided a solution to the problem such as a message of "Examination is needed for measures against hazards".

The case of the client 4 shows that each of the clock paths BO2 and BO1 in the type of clock has a problem as shown in FIG. 16, therefore only the clock types and the clock input elements having the problems are displayed as shown in FIG. 19, and there is provided a solution to the problems such as a message of "Examination is needed for measures against hazards as well as measures for synchronization".

Further, the case of the client 5 shows that the input clocks A/B in the type of clock and the output Q for the flip-flop FFA4 have problems respectively as shown in FIG. 17, therefore only the clock types and the clock input elements having the problems are displayed as shown in FIG. 20, and there is provided a solution to the problems such as a message of "Examination is needed for measures for synchronization as well as measures against hazards".

As described above, with the computer-aided logic circuit designing apparatus according to the present invention, data on a plurality of circuits is combined, a clock system portion is analyzed based on a logic circuit obtained by combining the data, and a result of analysis is displayed differentiating clock systems from each other, so that a trouble generated in a clock system portion in any of a plurality of blocks can clearly be known from a logic circuit being designed, and a long time is not required for analyzing a cause for the trouble, and for this reason it is possible to obtain a computer-aided logic circuit designing apparatus which can improve the work efficiency.

With the computer-aided logic circuit designing apparatus according to the present invention, data on a plurality of circuits is combined, a clock system portion is analyzed based on a logic circuit obtained by combining the data, a result of the analysis is displayed correlating a clock input element to each type of clock system, so that a trouble relating to a clock input element in a clock system portion in any of a plurality of blocks can clearly be identified from a logic circuit being designed and a long time is not required for analyzing a cause for each trouble, and for this reason it is possible to obtain a computer-aided logic circuit designing apparatus which can improve the work efficiency.

With the computer-aided logic circuit designing apparatus according to the present invention, data on a plurality of circuits is previously stored, the data on the plurality of circuits is combined, a clock system portion is analyzed based on the logic circuit obtained by combining the data, and a result of the analysis is displayed differentiating clock system types from each other, so that a trouble in a clock system portion in each of a plurality of blocks can clearly be identified from a logic circuit being designed, and a long time is not required for analyzing a cause for the trouble even if a portion or all of old resources is used, and for this reason it is possible to obtain a computer-aided logic circuit designing apparatus which can improve the work efficiency.

With the computer-aided logic circuit designing apparatus according to the present invention, data on a plurality of circuits is stored, the data on a plurality of circuits is combined, a clock system portion is analyzed based on the logic circuit obtained by combining the data, and a result of the analysis is displayed correlating a clock input element to each type of clock system, so that a trouble relating to a clock input element in a clock system portion of any of a plurality of blocks can clearly be identified from a logic circuit being designed, and a long time is not required for analyzing a cause for the trouble even if a portion or all of old resources is used, and for this reason it is possible to obtain a computer-aided logic circuit designing apparatus which can improve the work efficiency.

With the computer-aided logic circuit designing apparatus according to the present invention, data on each circuit is modified based on the display result of analysis, so that a work for correcting the trouble can immediately be started after analysis, and for this reason it is possible to obtain a computer-aided logic circuit designing apparatus which can improve the work efficiency.

With the computer-aided logic circuit designing apparatus according to the present invention, an asynchronous circuit portion is extracted from the logic circuit through analysis of a clock system, and when displaying the result of analysis, an alarm concerning the extracted asynchronous circuit portion is generated, so that the asynchronous circuit portion is clearly identified through the analysis of a clock system and a long time is not required for analyzing a cause for the trouble even in not only the clock system but also the asynchronous circuit portion, and for this reason it is possible to obtain a computer-aided logic circuit designing apparatus which can improve the work efficiency.

With the computer-aided logic circuit designing apparatus according to the present invention, the data for each circuit is corrected based on a displayed result of analysis to evade hazards in a clock system and for synchronization for an asynchronous circuit portion, so that a work for correcting the trouble in the clock system portion and the asynchronous circuit portion can immediately be started after analysis, and for this reason it is possible to obtain a computer-aided logic circuit designing apparatus which can improve the work efficiency.

With the computer-aided logic circuit designing apparatus according to the present invention, the analysis result in which data for types of clock system, data on clock input elements, and data for warning to troubles in clock systems are correlated to each other is obtained through analysis of the clock system, and for this reason it is possible to obtain a computer-aided logic circuit designing apparatus which can easily obtain a state of the clock system on the whole through analysis of a clock system.

With the computer-aided logic circuit designing apparatus according to the present invention, a clock path for each type of clock system is further correlated to data for types of clock system, data on clock input elements, and data for warning to troubles in clock systems, and for this reason it is possible to obtain a computer-aided logic circuit designing apparatus which can easily check a state of combining clock paths between blocks.

With the computer-aided logic circuit designing system according to the present invention, each client designs data on a circuit having a clock system portion, sends a request for analysis of data on the designed circuit to the server, and displays a result of analysis reported from the server after a request for analysis is sent differentiating clock systems from each other; and the server combines data on circuits sent from the plurality of clients respectively upon the request, analyzes a clock system portion based on a logic circuit obtained by combining the data, and reports the result of analysis to the plurality of clients, so that the server can centralize management of troubles in the clock system portion in any of the plurality of blocks from a logic circuit being designed in each client, and there is no load to analyze a cause for the trouble by a client side, and for this reason it is possible to obtain a computer-aided logic circuit designing system which can improve the work efficiency in the entire system.

With the computer-aided logic circuit designing system according to the present invention, each of the clients designs data on a circuit having one or a plurality of clock input elements each constituting a clock system portion, sends a request for analysis of data on the designed circuit to the server, and displays a result of analysis reported, after a request for analysis, from the server correlating a clock input element to each type of clock system; and the server combines data on circuits sent from the plurality of clients respectively, analyzes a clock system portion based on the logic circuit obtained by combining the data, and reports the result of analysis to the plurality of clients, so that the server can centralize management of troubles concerning a clock input element in the clock system portion in any of the plurality of blocks from a logic circuit being designed in each client, and there is no load to analyze a cause for the trouble by a client side, and for this reason it is possible to obtain a computer-aided logic circuit designing system which can improve the work efficiency in the entire system.

With the computer-aided logic circuit designing system according to the present invention, each client corrects the data on the circuit based on the displayed analysis result, so that a work for correcting the trouble can immediately be started in each client after analysis by the server, and for this reason it is possible to obtain a computer-aided logic circuit designing system which can improve the work efficiency.

With the computer-aided logic circuit designing system according to the present invention, an asynchronous circuit portion is extracted from the logic circuit by means of clock system analysis in the server, and when displaying the result of analysis in each client, an alarm for the extracted asynchronous circuit portion is generated, so that the asynchronous circuit portion is clearly identified through the analysis of a clock system and, in each client, a long time is not required for analyzing a cause for the trouble even in not only the clock system but also the asynchronous circuit portion, and for this reason it is possible to obtain a computer-aided logic circuit designing system which can improve the work efficiency on the system.

With the computer-aided logic circuit designing system according to the present invention, each of the clients corrects the data for each circuit to evade hazards for a clock system portion and for synchronization for the asynchronous circuit portion based on the displayed result of analysis, so that a work for correcting the trouble in the clock system portion and the asynchronous circuit portion can immediately be started after analysis by the server, and for this reason it is possible to obtain a computer-aided logic circuit designing system which can improve the work efficiency on the system.

With the computer-aided logic circuit designing system according to the present invention, the analysis result in which data for types of clock system, data on clock input elements, and data for warning to troubles in clock systems are correlated to each other is obtained through analysis of the clock system by the server, and for this reason it is possible to obtain a computer-aided logic circuit designing system in which a state of the clock system obtained through analysis of the clock system can easily be checked on the whole in the server.

With the computer-aided logic circuit designing system according to the present invention, the server further correlates a clock path for each type of clock to data for types of clock system, data on clock input elements, and data for warning to troubles in clock systems, and for this reason it is possible to obtain a computer-aided logic circuit designing system in which a state of combining clock paths between blocks can easily be checked in each client.

With the computer-aided logic circuit designing method according to the present invention, there are steps of combining data on a plurality of circuits each having a clock system portion, analyzing a clock system portion based on the logic circuit obtained by combining the data on a plurality of circuits, and displaying the result of analysis obtained by analyzing the logic circuit differentiating the clock systems from each other, so that a trouble generated in a clock system portion in any of a plurality of blocks can clearly be identified from a logic circuit being designed, and a long time is not required for analyzing a cause for the trouble, and for this reason it is possible to obtain a computer-aided logic circuit designing method which can improve the work efficiency.

With the computer-aided logic circuit designing method according to the present invention, there are steps of combining data on a plurality of circuit, analyzing a clock system portion based on the logic circuit obtained by combining the data on the plurality of circuits, and displaying the result of analysis obtained by analyzing the logic circuit correlating each type of clock system to a corresponding clock input element, so that a trouble relating to a clock input element in a clock system portion in any of a plurality of blocks can clearly be identified from a logic circuit being designed, and a long time is not required for analyzing a cause for each trouble, and for this reason it is possible to obtain a computer-aided logic circuit designing method which can improve the work efficiency.

This application is based on Japanese patent application No. HEI 9-201906 filed in the Japanese Patent Office on Jul. 28, 1997, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A computer-aided logic circuit designing apparatus designing a logic circuit by integrating data on circuits comprising:
    a combining unit combining data on circuits into a combined circuit, each of the circuits having a clock system portion;
    a clock system analyzer analyzing clock system portions of the combined circuit by differentiating clock systems in said combined circuit; and
    an analysis result display unit displaying a result of the analysis of the combined circuit with the clock systems of the combined circuit differentiated from each other.

2. A computer-aided logic circuit designing apparatus according to claim 1 further comprising:
    a correcting unit correcting said data on circuits based on the result of analysis displayed by said analysis result display unit.

3. A computer-aided logic circuit designing apparatus according to claim 1, wherein said clock system analyzer extracts an asynchronous circuit portion from said combined circuit through analysis of a clock system, and said analysis result display unit generates, when displaying said result of analysis, an alarm concerning the asynchronous circuit portion extracted by said clock system analyzer.

4. A computer-aided logic circuit designing apparatus according to claim 1, wherein said clock system analyzer obtains said analysis result in which data for types of clock system, data on clock input elements, and data for warning of troubles in clock systems are correlated to each other.

5. A computer-aided logic circuit designing apparatus designing a logic circuit by integrating data on circuits comprising:
    a combining unit combining data on circuits into a combined circuit, each of the circuits having one or more clock input elements, each of the clock input elements constituting a clock system portion;
    a clock system analyzer analyzing clock system portions of the combined circuit by differentiating clock systems in said combined circuit; and
    an analysis result display unit displaying a result of the analysis of the combined circuit with the clock systems of the combined circuit differentiated from each other.

6. A computer-aided logic circuit designing apparatus according to claim 5 further comprising:
    a correcting unit correcting said data on circuits based on the result of analysis displayed by said analysis result display unit.

7. A computer-aided logic circuit designing apparatus according to claim 5, wherein said clock system analyzer extracts an asynchronous circuit portion from said combined circuit through analysis of a clock system, and said analysis result display unit generates, when displaying said result of analysis, an alarms concerning the asynchronous circuit portion extracted by said clock system analyzer.

8. A computer-aided logic circuit designing apparatus designing a logic circuit by integrating data on circuits comprising:
    a storage unit storing therein data on circuits, each of the circuits having a clock system portion;
    a combining unit reading out and combining into a combined circuit the data on circuits stored in said storage unit;
    a clock system analyzer analyzing clock system portions of the combined circuit by differentiating clock systems in said combined circuit; and
    an analysis result display unit displaying a result of the analysis of the combined circuit with the clock systems of the combined circuit differentiated from each other.

9. A computer-aided logic circuit designing apparatus according to claim 8 further comprising:
    a correcting unit correcting said data on circuits based on the result of analysis displayed by said analysis result display unit.

10. A computer-aided logic circuit designing apparatus according to claim 8, wherein said clock system analyzer extracts an asynchronous circuit portion from said combined circuit through analysis of a clock system, and said analysis result display unit generates, when displaying said result of analysis, an alarm concerning the asynchronous circuit portion extracted by said clock system analyzer.

11. A computer-aided logic circuit designing apparatus according to claim 8, wherein said clock system analyzer obtains said analysis result in which data for types of clock system, data on clock input elements, and data for warning of troubles in clock systems are correlated to each other.

12. A computer-aided logic circuit designing apparatus designing a logic circuit by integrating data on circuits comprising:
- a storage unit storing therein data on circuits, each of the circuits having one or more clock input elements, each of the clock input elements constituting a clock system portion;
- a combining unit reading out and combining into a combined circuit the data on circuits stored in said storage unit;
- a clock system analyzer analyzing clock system portions of the combined circuit by differentiating clock systems in said combined circuit; and
- an analysis result display unit displaying a result of the analysis of the combined circuit with the clock systems of the combined circuit differentiated from each other.

13. A computer-aided logic circuit designing apparatus according to claim 12 further comprising:
- a correcting unit correcting said data on circuits based on the result of analysis displayed by said analysis result display unit.

14. A computer-aided logic circuit designing apparatus according to claim 12, wherein said clock system analyzer extracts an asynchronous circuit portion from said combined circuit through analysis of a clock system, and said analysis result display unit generates, when displaying said result of analysis, an alarm concerning the asynchronous circuit portion extracted by said clock system analyzer.

15. A computer-aided logic circuit designing apparatus according to claim 12, wherein said clock system analyzer obtains said analysis result in which data for types of clock system, data on clock input elements, and data for warning of troubles in clock systems are correlated to each other.

16. A computer-aided logic circuit designing method of designing a logic circuit by integrating data on circuits comprising:
- combining data on circuits into a combined circuit, each of the circuits having a clock system portion;
- analyzing clock system portions of the combined circuit by differentiating clock systems in said combined circuit; and
- displaying the result of analysis of the combined circuit with the clock systems of the combined circuit differentiated from each other.

17. A computer-aided logic circuit designing method of designing a logic circuit by integrating data on circuits comprising:
- combining data on circuits into a combined circuit, each of the circuits having one or more clock input elements, each of the clock input elements constituting a clock system portion;
- analyzing clock system portions of the combined circuit by differentiating clock systems in said combined circuit; and
- displaying the result of analysis of the combined circuit with the clock systems of the combined circuit differentiated from each other.

18. A clock system analyzer for a computer-aided circuit designing apparatus designing a circuit by combining data on circuits into a combined circuit, each of the circuits having a clock system portion, the clock system analyzer comprising:
- a clock system analyzer unit to analyze clock system portions of the combined circuit by differentiating clock systems in said combined circuit; and
- an analysis result display unit displaying an analysis result of the combined circuit with the clock systems of the combined circuit differentiated from each other.

* * * * *